United States Patent
Itabashi

(10) Patent No.: US 9,265,147 B2
(45) Date of Patent: Feb. 16, 2016

(54) MULTI-LAYER WIRING BOARD

(71) Applicant: FUJIKURA LTD., Tokyo (JP)

(72) Inventor: Atsushi Itabashi, Chiba (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/075,023

(22) Filed: Nov. 8, 2013

(65) Prior Publication Data

US 2014/0131073 A1    May 15, 2014

(30) Foreign Application Priority Data

Nov. 14, 2012  (JP) ................. 2012-249904
Oct. 29, 2013  (JP) ................. 2013-224481

(51) Int. Cl.
  *H05K 1/11*  (2006.01)
  *H05K 1/18*  (2006.01)
  *H05K 3/46*  (2006.01)

(52) U.S. Cl.
  CPC ............. *H05K 1/112* (2013.01); *H05K 1/185* (2013.01); *H05K 1/186* (2013.01); *H05K 3/4638* (2013.01); *H05K 1/116* (2013.01); *H05K 2201/0195* (2013.01); *H05K 2203/061* (2013.01)

(58) Field of Classification Search
  CPC ....... H05K 1/112; H05K 1/185; H05K 1/188; H05K 1/251; H05K 1/113; H05K 1/182; H05K 1/183; H05K 1/114; H01L 23/5389
  USPC .......... 174/255, 260, 761, 261, 267, 263, 26, 174/4; 257/E23.178, 698, E21.503
  See application file for complete search history.

(56) References Cited

U.S. PATENT DOCUMENTS

| 5,619,072 | A  | * | 4/1997  | Mehta ............................ 257/774 |
| 6,495,772 | B2 | * | 12/2002 | Anstrom ............. H01L 23/5383 174/255 |
| 7,572,681 | B1 | * | 8/2009  | Huemoeller et al. ......... 438/125 |
| 8,323,771 | B1 | * | 12/2012 | Huemoeller et al. ......... 428/138 |
| 2004/0200065 | A1 | * | 10/2004 | Tsukahara et al. ............. 29/832 |
| 2006/0021791 | A1 | * | 2/2006  | Sunohara et al. ............. 174/255 |
| 2007/0069363 | A1 | * | 3/2007  | Kawabata et al. ............ 257/698 |
| 2008/0225501 | A1 | * | 9/2008  | Cho ....................... H05K 3/421 361/767 |
| 2010/0236698 | A1 | * | 9/2010  | Sekimoto ...................... 156/221 |
| 2011/0074024 | A1 | * | 3/2011  | Pendse .......................... 257/737 |

FOREIGN PATENT DOCUMENTS

| JP | 2004-031531 A | 1/2004 |
| JP | 2004-311786 A | 11/2004 |
| JP | 2006-93439 A  | 4/2006 |
| WO | 2007/069789 A1 | 6/2007 |
| WO | 2009/081853 A1 | 7/2009 |

* cited by examiner

*Primary Examiner* — Tuan T Dinh
*Assistant Examiner* — Steven T Sawyer
(74) *Attorney, Agent, or Firm* — Westerman, Hattori, Daniels & Adrian, LLP

(57) ABSTRACT

A multi-layer wiring board includes a resin base, a wiring pattern, an adhesive layer, and a via. The wiring pattern includes a land provided on the resin base. The adhesive layer is stacked on the resin base. The via is formed in the adhesive layer and has an end connected to the land. At least a portion of a side surface of the land contacts the via.

9 Claims, 13 Drawing Sheets (a) Comparative Example (Top View)

(b) Comparative Example (Cross-Sectional View along A-A')

(a) First Embodiment (Top View)

(b) First Embodiment (Cross-Sectional View along B-B')

MULTI-LAYER WIRING BOARD

CROSS-REFERENCE TO RELATED APPLICATIONS

This application is based upon and claims the benefit of priority from the prior Japanese Patent Application No. 2012-249904, filed on Nov. 14, 2012, and the prior Japanese Patent Application No. 2013-224481, filed on Oct. 29, 2013, the entire contents of which are incorporated herein by reference.

BACKGROUND OF THE INVENTION

1. Field of the Invention

This invention relates to a multi-layer wiring board in which connection between layers is made by a via.

2. Description of the Prior Art

In recent years, an increasingly high degree of functionalization of semiconductor devices is being required as multi-functionalization of mobile devices proceeds. Moreover, in order to meet this requirement, wiring technology of semiconductor devices is improving and miniaturization of wiring lines is advancing. A multi-layer wiring board is known as a high-density wiring technology, but as described in, for example, Japanese Unexamined Patent Application Publication No. 2004-31531 A, a diameter of a land connected to an end of an inter-layer-connecting via is generally set large with respect to a diameter of the via. In addition, a diameter of an electrode of an electronic component connected to an end of a via is similarly set large with respect to a diameter of the via.

However, in a structure where the diameter of the land is large with respect to the diameter of the via as in above-described Japanese Unexamined Patent Application Publication No. 2004-31531A, a space between lands becomes narrow. Hence, there is a problem that in cases like where a semiconductor device having narrow-pitched electrode pads such as a WLCSP (Wafer Level Chip Size Package) is built in or connected, lead-out of a wiring line from a via connected to the electrode pad is difficult. Accordingly, it is also conceivable for a space between the lands or the electrodes to be secured by setting the diameter of the land or the electrode as small as possible. However, if the diameter of the land or the electrode is set small, a contact area between the via and the land or electrode becomes small, whereby wiring resistance or connection resistance increases, or a minute positional misalignment between the land or electrode and the via causes a wiring defect or connection defect to occur.

SUMMARY OF THE INVENTION

This invention has an object of overcoming the above-mentioned problems due to the prior art to provide a multi-layer wiring board which is capable of suppressing an increase in wiring resistance or connection resistance, or occurrence of a wiring defect or connection defect.

A multi-layer wiring board according to an embodiment of the present invention comprises: a resin base; a wiring pattern provided on the resin base and including a land; an adhesive layer on which the resin base is stacked; and a via formed in the adhesive layer and having an end connected to the land, at least a portion of a side surface of the land contacting the via.

In the multi-layer wiring board according to the embodiment of the present invention, the land is formed on the resin base, the via is formed in the adhesive layer on which the resin base is stacked, and a portion of the side surface of the land contacts the via. Therefore, even if a misalignment occurs between the via and the land, a lowering of contact area between the via and the land can be suppressed. As a result, the present invention can suppress an increase in wiring resistance or occurrence of a wiring defect.

In another embodiment of the multi-layer wiring board, the land is embedded in the via. This enables a contact area of the via and the land to be increased.

Moreover, in another embodiment of the multi-layer wiring board, a diameter of the land is smaller than a diameter of the via. This enables an occupied area of the land to be reduced, and a pitch between signal-dedicated wiring lines to be reduced too. Therefore, a high-density layout of the signal-dedicated wiring lines can be achieved.

Moreover, in another embodiment of the multi-layer wiring board, an electronic component including a plurality of electrode pads arranged with a certain pitch therein is built in the multi-layer wiring board, and an end of the via to which the land is not connected is connected to the electrode pad.

A multi-layer wiring board according to another embodiment of the present invention comprises: an electronic component; an electrode provided to the electronic component; an adhesive layer on which the electronic component is stacked; and a via formed in the adhesive layer and having an end connected to the electrode, at least a portion of a side surface of the electrode contacting the via.

Due to the multi-layer wiring board according to the other embodiment of the present invention, the electrode is formed on the electronic component, the via is formed in the adhesive layer on which the electronic component is stacked, and at least a portion of the side surface of the electrode contacts the via. Therefore, even if a misalignment occurs between the via and the electrode, a lowering of contact area between the via and the electrode can be suppressed. As a result, an increase in connection resistance or occurrence of a connection defect can be suppressed.

A multi-layer wiring board according to yet another embodiment of the present invention comprises: a built-in component; an electrode provided to the built-in component; an adhesive layer on which the built-in component is stacked; and a via formed in the adhesive layer and having an end connected to the electrode, at least a portion of a side surface of the electrode contacting the via.

Due to the multi-layer wiring board according to the yet another embodiment of the present invention, similar working effects to those of the above-described multi-layer wiring board according to the other embodiment can be provided.

In yet another embodiment of the multi-layer wiring board, the electrode is embedded in the via. This enables a contact area of the via and the electrode to be increased.

Moreover, in yet another embodiment of the multi-layer wiring board, a diameter of the electrode is smaller than a diameter of the via. This enables an occupied area of the electrode to be reduced, and a pitch between the electrodes to be reduced too. Therefore, a high-density layout of the electrodes can be achieved.

Moreover, in yet another embodiment of the multi-layer wiring board, the multi-layer wiring board comprises a wiring pattern provided on a resin base and including a land, and an end of the via not connected to the electrode is connected to the land.

DETAILED DESCRIPTION

A multi-layer wiring board according to embodiments of this invention will be described in detail below with reference to the accompanying drawings.

First Embodiment

Figure 1:
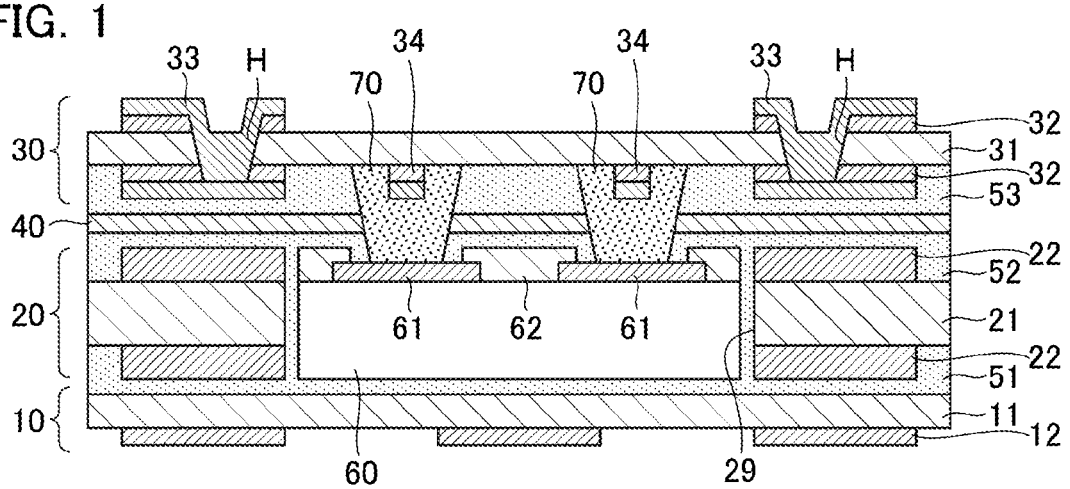
FIG. 1 is a cross-sectional view showing a structure of a component-built-in board according to a first embodiment of the present invention.

FIG. 1 is across-sectional view showing a structure of a component-built-inboard (multi-layer wiring board) according to a first embodiment of the present invention. As shown in FIG. 1, the component-built-in board according to the first embodiment of the present invention comprises a structure in which a first printed wiring base 10, a second printed wiring base 20, a protective layer 40, and a third printed wiring base 30 are stacked by thermal compression bonding (adhesive layers 51 to 53).

The adhesive layer 51 adheres between the first printed wiring base 10 and the second printed wiring base 20. The adhesive layer 52 adheres between the second printed wiring base 20 and the protective layer 40. The adhesive layer 53 adheres between the protective layer 40 and the third printed wiring base 30. The protective layer 40 is configured from an insulating film (PET, a polyimide, a liquid crystal polymer, or the like) in order to prevent a short-circuit between layers during thermal compression bonding. The adhesive layers 51 to 53 are configured from, for example, an epoxy system or acrylic system adhesive, an organic system adhesive, and so on.

Furthermore, as shown in FIG. 1, the component-built-in board includes an electronic component 60 and a via 70. The electronic component 60 is built in to an opening 29 formed in the second printed wiring base 20, in a state of being sandwiched by the first and third printed wiring bases 10 and 30. The via extends in a stacking direction penetrating the protective layer 40 to be provided between the electronic component 60 and the third printed wiring base 30. The via 70 is configured by an alloy including a low-melting-point metal filler and a high-melting-point metal filler, and has its surface covered by a thermosetting resin. Now, the metal filler is, for example, nickel, gold, silver, copper, aluminum, iron, tin, bismuth, indium, lead, or the like. The thermosetting resin is a paste whose main component is, for example, an epoxy, an acrylic, a urethane, and so on.

As shown in FIG. 1, the first through third printed wiring bases 10 to 30 respectively include first through third resin bases 11 to 31 and signal-dedicated wiring lines 12 to 32. The signal-dedicated wiring line 12 is formed on a lower surface (one surface) of the first resin base 11. The signal-dedicated wiring line 22 is formed on a lower surface and an upper surface (both surfaces) of the second resin base 21. The signal-dedicated wiring line 32 is formed on a lower surface and an upper surface (both surfaces) of the third resin base 31.

The first through third resin bases 11 to 31 are configured by a resin film. Now, the resin film is, for example, a polyimide, a polyolefin, a liquid crystal polymer, a thermosetting epoxy resin, or the like. The signal-dedicated wiring lines 12 to 32 are configured by a conductive material such as copper foil formed in a pattern.

In addition, as shown in FIG. 1, the third printed wiring base 30 includes: a signal-dedicated via 33 that fills a via hole H that penetrates the third resin base 31; and a land 34 provided at a leading end of the signal-dedicated wiring line 32.

Figure 2:
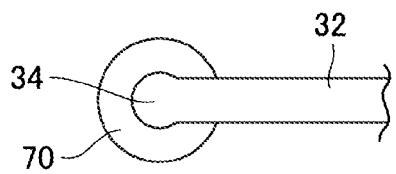
FIG. 2 is a top view showing a relationship between a land 34 and a via 70 according to the first embodiment.

The signal-dedicated via 33 is connected to the signal-dedicated wiring line 32 formed on both surfaces of the third resin base 31. The signal-dedicated via 33 is formed by a plating. The land 34 is provided on a lower surface of the third resin base 31. Now, FIG. 2 is a top view showing a relationship between the land 34 and the via 70 according to the first embodiment. As shown in FIG. 2, a diameter of the land 34 is smaller than a diameter of the via 70, and the land 34 is embedded in the via 70. Therefore, the land 34 contacts the via 70 not only at a lower surface of the land 34 but also at a side surface of the land 34. The land 34 is configured by a conductive material such as copper foil formed in a pattern, and forms an alloy with the via 70.

The electronic component 60 is configured by a WLP (Wafer Level Package). As shown in FIG. 1, an electrode 61 and a resin 62 are provided to an upper surface of the electronic component 60. The electrode 61 is electrically connected to a lower end of the via 70. The electrode 61 is configured by a conductive material such as copper, and forms an alloy with the via 70. The resin 62 covers the upper surface of the electronic component 60 so as to expose the electrode 61.

Figure 3A:
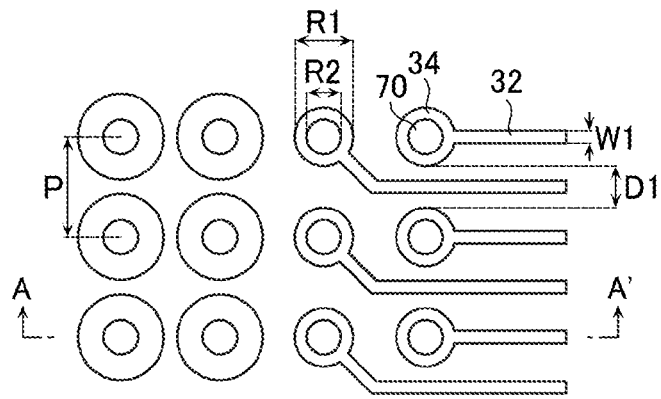
FIG. 3A is a top view and a cross-sectional view according to a comparative example.
Figure 3A:
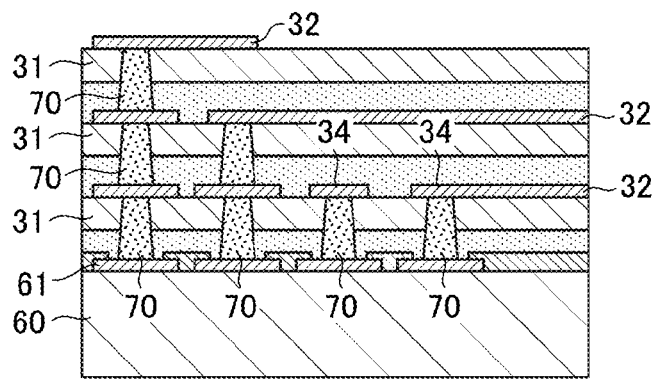
Figure 3B:
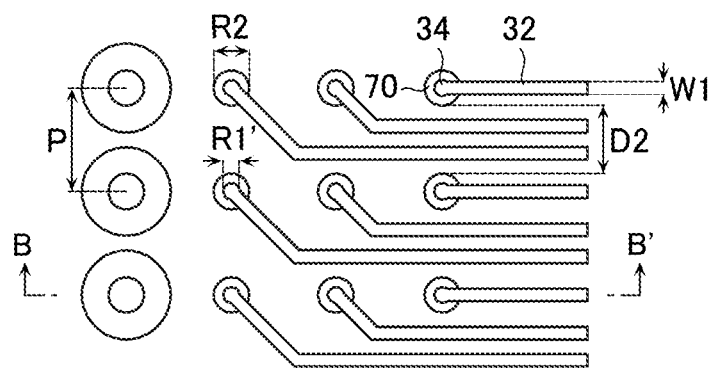
FIG. 3B is a top view and a cross-sectional view of the component-built-in board according to the first embodiment.
Figure 3B:
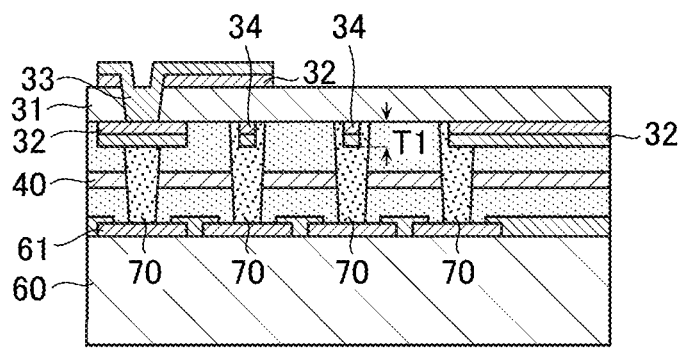

Next, effects of the first embodiment are described by comparing the first embodiment with a comparative example, with reference to FIGS. 3A and 3B. FIG. 3A(a) is a top view showing a via 70, a signal-dedicated wiring line 32, and a land 34 of the comparative example, and FIG. 3A(b) is a cross-sectional view taken along the line A-A' of FIG. 3A(a). FIG. 3B(a) is a top view showing an example of the via 70, the signal-dedicated wiring line 32, and the land 34 of the first embodiment, and FIG. 3B(b) is a cross-sectional view taken along the line B-B' of FIG. 3B(a).

As shown in FIG. 3A, in the comparative example, the via 70 contacts a lower surface of the land 34, and a diameter of the land 34 is larger than a diameter of the via 70. Therefore, a spacing between the lands 34 becomes narrow, and the number of signal-dedicated wiring lines 32 capable of being wired gets reduced.

For example, in the comparative example shown in FIG. 3A(a), if a pitch P of the vias 70 is assumed to be 300 μm, a diameter R1 of the land 34 is assumed to be 170 μm, and a diameter R2 of the via 70 is assumed to be 100 μm, then a wiring-capable width D1 between adjacent lands 34 is 300–170=130 μm. Therefore, if a width W1 of the signal-dedicated wiring line 32 is assumed to be 40 μm, and a minimum required spacing between wiring lines is assumed to be 40 μm, then only one signal-dedicated wiring line 32 can be formed between the lands 34.

In contrast, as shown in FIGS. 3B(a) and 3B(b), in the example of the first embodiment, a diameter R1' of the land 34 is smaller than the diameter R2 of the via 70. According to the above-mentioned example, a wiring-capable width D2 between adjacent vias 70 is 300–100=200 μm. As a result, if the width W1 of the signal-dedicated wiring line 32 is assumed to be 40 μm, and the minimum required spacing between wiring lines is assumed to be 40 μm, then two signal-dedicated wiring lines 32 can be disposed between the lands 34, and a more high-density layout of the signal-dedicated wiring lines 32 can be achieved than in the comparative example.

Due to the above differences, the number of wiring lines capable of being wired in an identical layer is greater in the first embodiment than in the comparative example. As a result, as shown in FIGS. 3A(b) and 3B(b), whereas in the comparative example, three layers were required in disposition of the signal-dedicated wiring lines 32, in the first embodiment, two layers are sufficient for disposition of the signal-dedicated wiring lines 32.

On the other hand, in the case where, due to the diameter R1' of the land 34 being smaller than the diameter R2 of the via 70 as in the first embodiment, a contact area of the via 70 and the land 34 becomes small and a positional misalignment between the via 70 and the land 34 occurs, there is an increased likelihood that a wiring defect is caused. In this regard, in the first embodiment, the land 34 is embedded in an upper end of the via 70, and not only the lower surface of the land 34 contacts the via 70, but also the side surface of the land 34 contacts the via 70 with a width of T1. Therefore, the contact area can be increased and, even if misalignment of the via 70 and the land 34 occurs, a lowering of contact area of the via 70 and the land 34 and a wiring defect can be suppressed.

Figure 4:
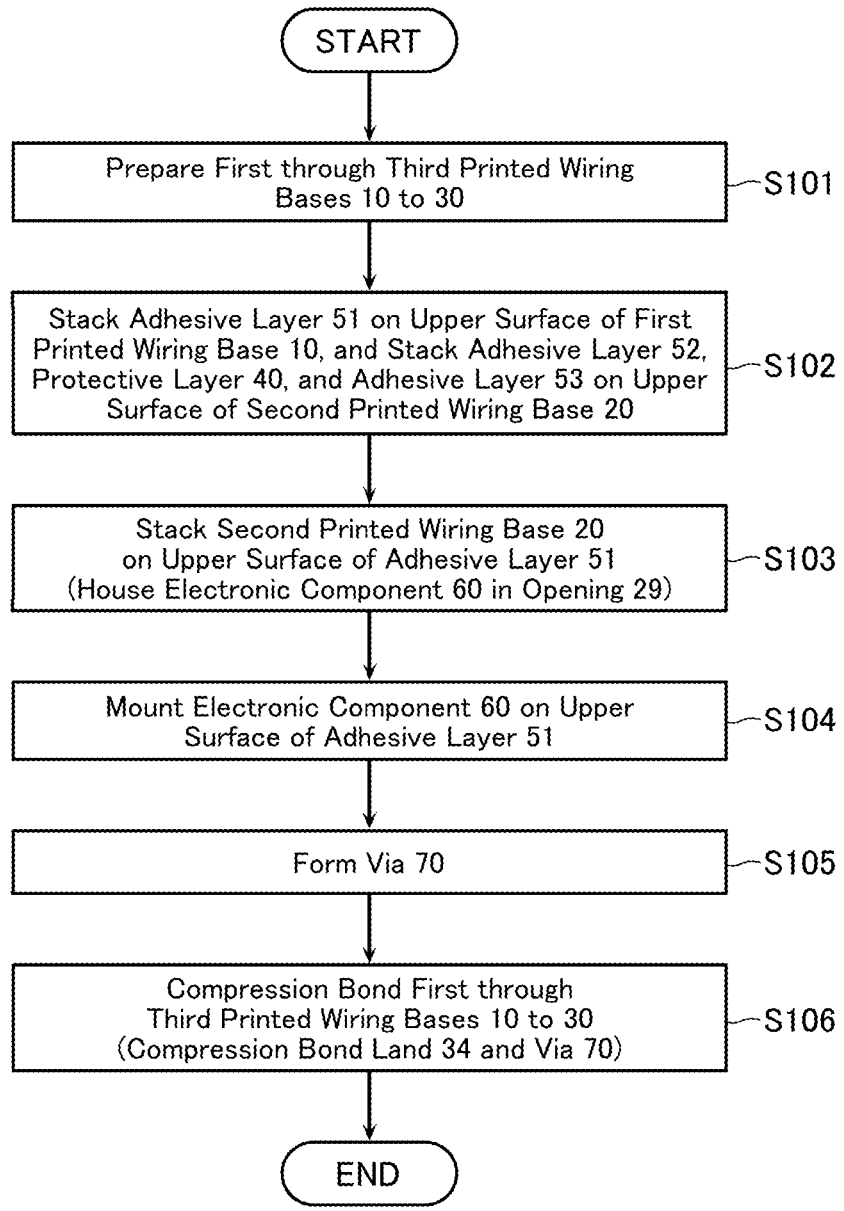
FIG. 4 is a flowchart showing manufacturing processes of the component-built-in board according to the first embodiment of the present invention.

Next, a manufacturing method of the component-built-in board according to the first embodiment will be described in line with FIG. 4, with reference to FIGS. 5 to 9. FIG. 4 is a flowchart showing manufacturing processes of the component-built-in board. FIGS. 5 to 9 are cross-sectional views showing schematically the manufacturing processes of the component-built-in board.

Figure 5:
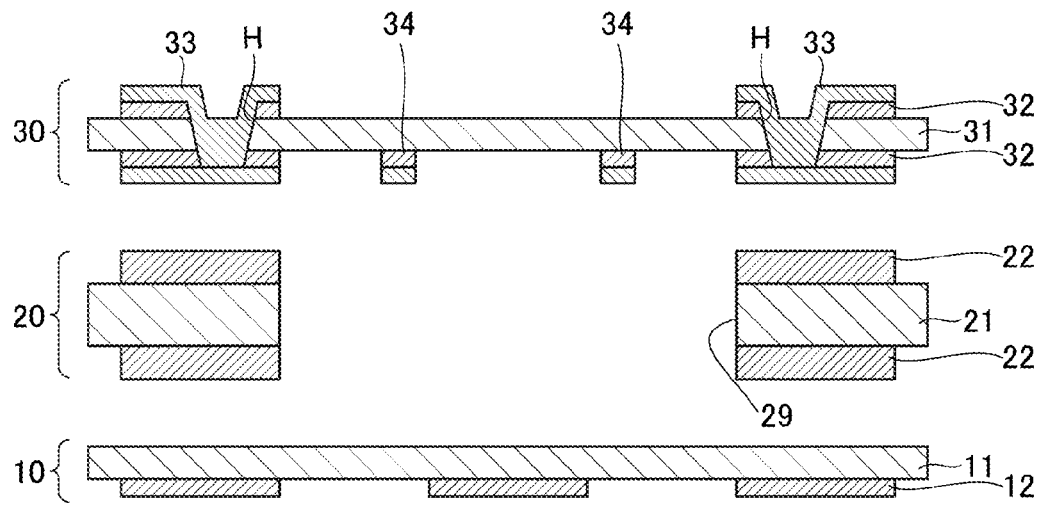
FIG. 5 is a cross-sectional view showing schematically a manufacturing process of same component-built-in board.
Figure 6:
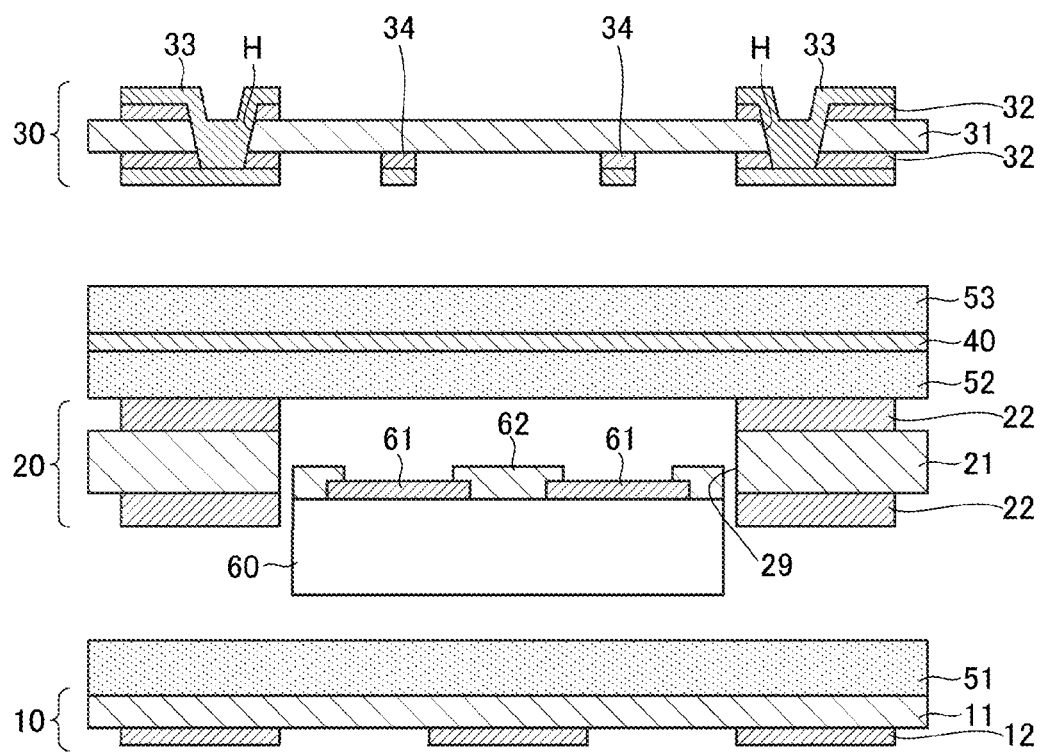
FIG. 6 is a cross-sectional view showing schematically a manufacturing process of same component-built-in board.

First, as shown in FIG. 5, the first through third printed wiring bases 10 to 30 are prepared (S101 of FIG. 4). Now, the signal-dedicated wiring lines 12 to 32 of the first through third printed wiring bases 10 to 30 are formed by a subtractive method or a semi-additive method. In addition, the opening 29 of the second printed wiring base 20 is formed by laser processing, drill processing, or die processing. Next, as shown in FIG. 6, the adhesive layer 51 is stacked on the upper surface of the first printed wiring base 10, and the adhesive layer 52, the protective layer 40, and the adhesive layer 53 are stacked on the upper surface of the second printed wiring base 20 (S102 of FIG. 4).

Figure 7:
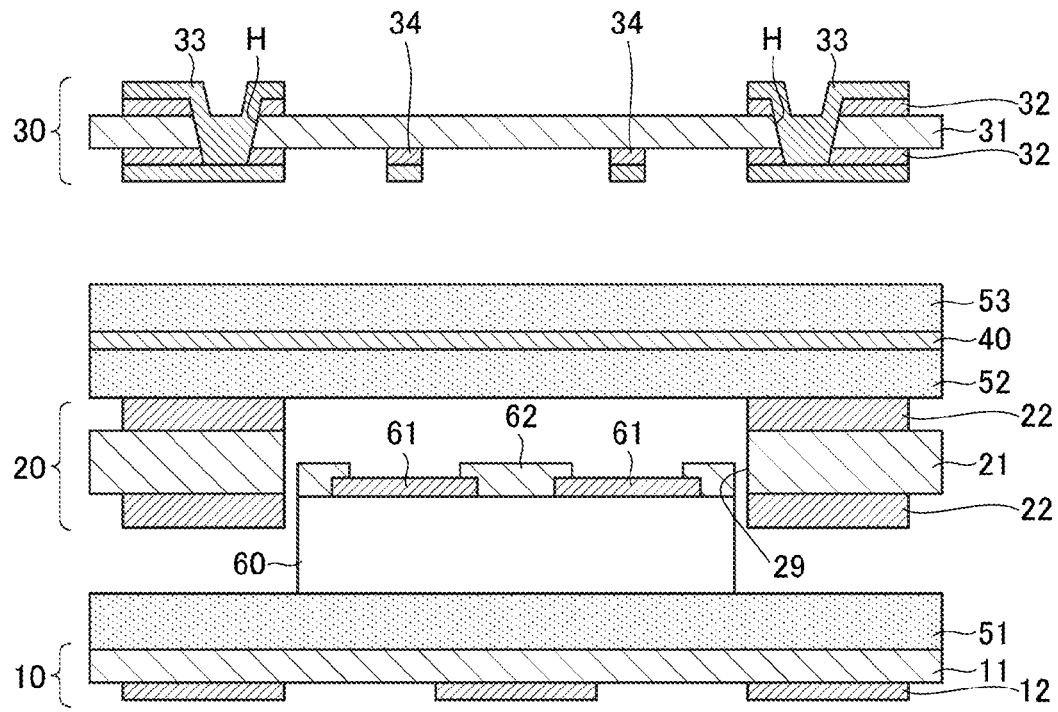
FIG. 7 is a cross-sectional view showing schematically a manufacturing process of same component-built-in board.
Figure 8:
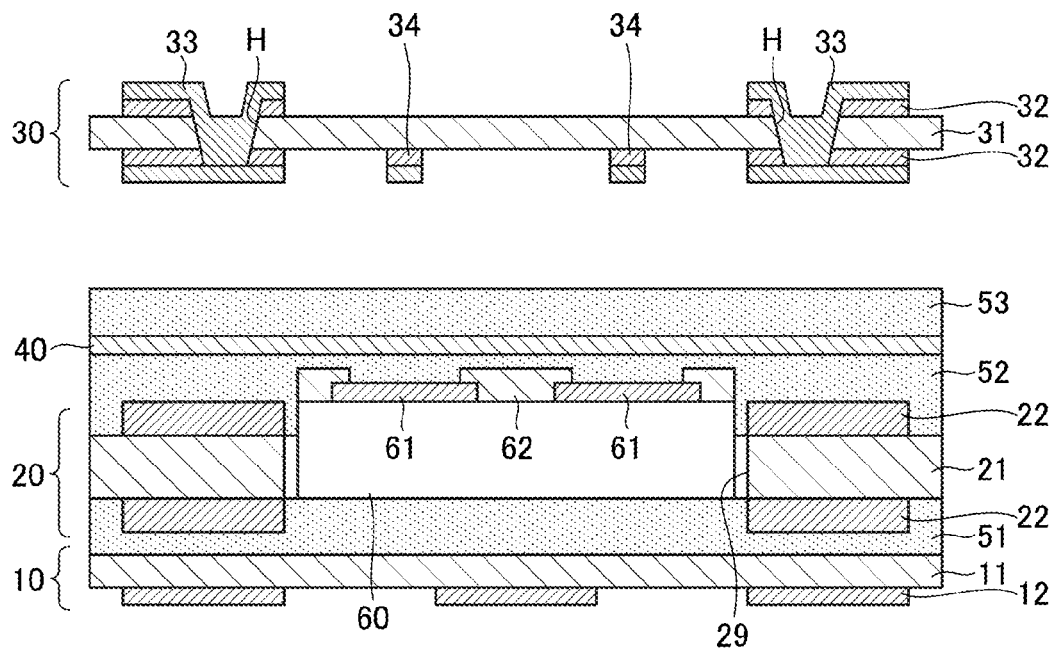
FIG. 8 is a cross-sectional view showing schematically a manufacturing process of same component-built-in board.

Following this, as shown in FIG. 7, the electronic component 60 is mounted on the upper surface of the adhesive layer 51 (S103 of FIG. 4). Next, as shown in FIG. 8, the second printed wiring base 20 is stacked on the upper surface of the adhesive layer 51 so as to contain the electronic component 60 in the opening 29 (S104 of FIG. 4).

Figure 9:
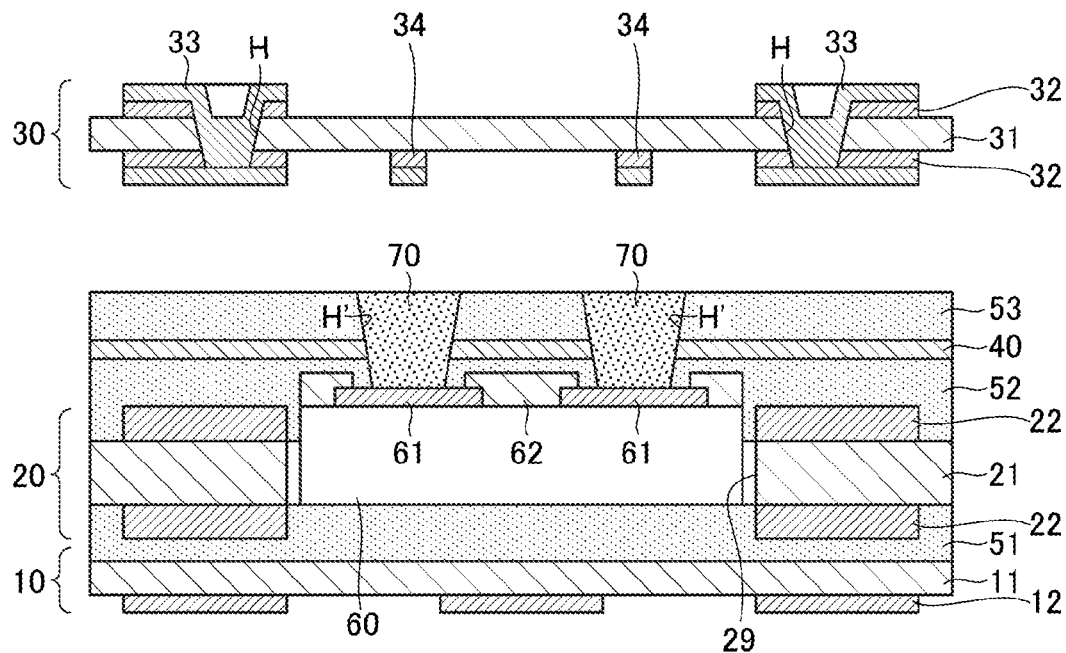
FIG. 9 is a cross-sectional view showing schematically a manufacturing process of same component-built-in board.

Following this, a hole H' penetrating the protective layer 40 is formed by laser processing. Next, as shown in FIG. 9, the via 70 is formed by filling the hole H' with a conductive paste (S105 of FIG. 4). Then, the third printed wiring base 30 is stacked on the upper surface of the adhesive layer 53, and the first through third printed wiring bases 10 to 30 undergo thermal compression bonding (S106 of FIG. 4). As a result, the first through third printed wiring bases 10 to 30 are compression bonded such that the land 34 is embedded in the upper end of the via 70, whereby the component-built-in board shown in FIG. 1 is manufactured. During this compression bonding of the land 34 and the via 70, the low-melting-point metal filler and the thermosetting resin in the via 70 melt. The melted low-melting-point metal filler forms an alloy with copper of the land 34.

Second Embodiment

Next, a multi-layer wiring board according to a second embodiment of the present invention will be described with reference to FIG. 10. The first embodiment was a component-built-in board having an electronic component 60 built therein. However, as shown in FIG. 10, a multi-layer wiring board 80 of the present embodiment is provided between an electronic component 90 and a mounting board 100, and functions as an interposer electrically connecting these electronic component 90 and mounting board 100.

Figure 10:
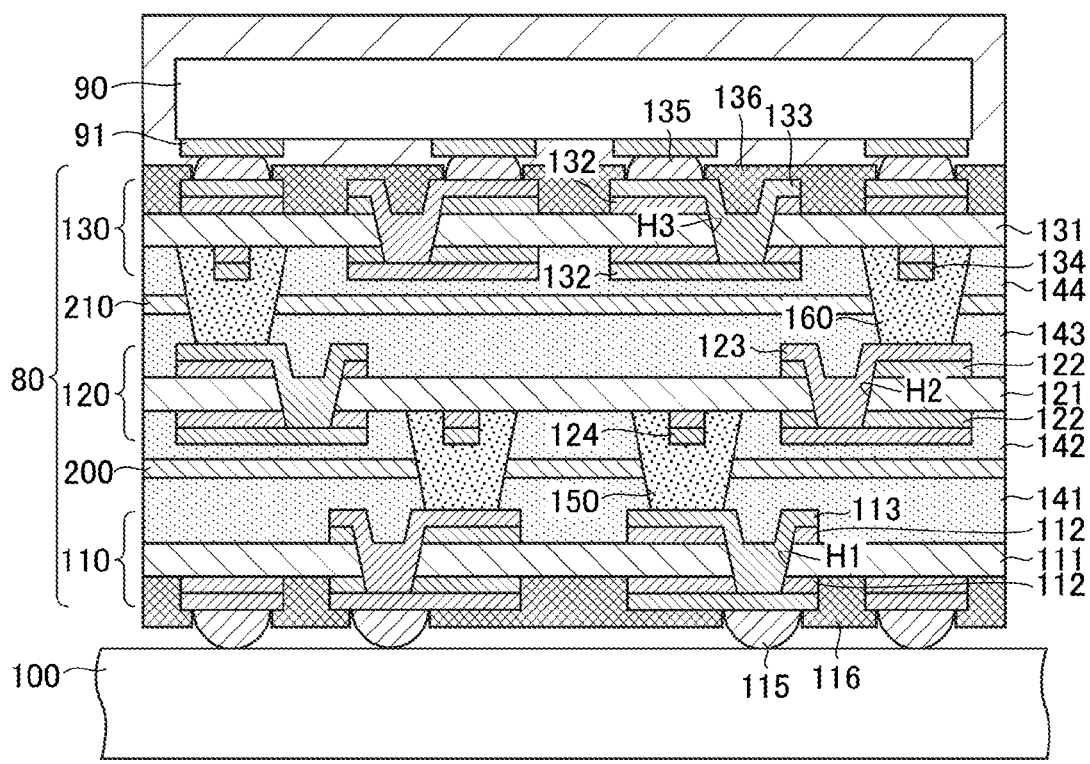
FIG. 10 is a cross-sectional view showing a structure of a multi-layer wiring board according to a second embodiment of the present invention.

As shown in FIG. 10, the multi-layer wiring board 80 comprises a structure in which a first printed wiring base 110, a protective layer 200, a second printed wiring base 120, a protective layer 210, and a third printed wiring base 130 are stacked by thermal compression bonding (adhesive layers 141 to 144).

The adhesive layer 141 adheres between the first printed wiring base 110 and the protective layer 200. The adhesive layer 142 adheres between the protective layer 200 and the second printed wiring base 120. The adhesive layer 143 adheres between the second printed wiring base 120 and the protective layer 210. The adhesive layer 144 adheres between the protective layer 210 and the third printed wiring base 130. Note that the protective layers 200 and 210, and the adhesive layers 141 to 144 are configured by similar materials to the protective layer 40 and the adhesive layers 51 to 53 of the first embodiment.

Furthermore, as shown in FIG. 10, the multi-layer wiring board 80 includes vias 150 and 160. The vias 150 and 160 extend in the stacking direction. The via 150 penetrates the protective layer 200 to be provided between the first printed wiring base 110 and the second printed wiring base 120. The via 160 penetrates the protective layer 210 to be provided between the second printed wiring base 120 and the third printed wiring base 130. Note that the vias 150 and 160 are configured by a similar material to the via 70 of the first embodiment.

As shown in FIG. 10, the first through third printed wiring bases 110 to 130 respectively include first through third resin bases 111 to 131, signal-dedicated wiring lines 112 to 132, and signal-dedicated vias 113 to 133. The signal-dedicated wiring line 112 is formed on a lower surface and an upper surface (both surfaces) of the first resin base 111. The signal-dedicated wiring line 122 is formed on a lower surface and an upper surface (both surfaces) of the second resin base 121. The signal-dedicated wiring line 132 is formed on a lower surface and an upper surface (both surfaces) of the third resin base 131. The signal-dedicated vias 113 to 133 respectively fill via holes H1 to H3 that penetrate the first through third resin bases 111 to 131. The signal-dedicated vias 113 to 133 are respectively electrically connected to the signal-dedicated wiring lines 112 to 132 formed on both surfaces of the first through third resin bases 111 to 131. Note that the first through third resin bases 111 to 131, the signal-dedicated wiring lines 112 to 132, and the signal-dedicated vias 113 to 133 are configured by similar materials to the first through third resin bases 11 to 31, the signal-dedicated wiring lines 12 to 32, and the signal-dedicated via 33 of the first embodiment.

In addition, as shown in FIG. 10, the second and third printed wiring bases 120 and 130 respectively include lands 124 and 134 provided at leading ends of the signal-dedicated wiring lines 122 and 132. The lands 124 and 134 are provided on the lower surfaces of the second and third resin bases 121 and 131. Specifically, diameters of the lands 124 and 134 are respectively smaller than diameters of the vias 150 and 160, and the lands 124 and 134 are embedded in the vias 150 and 160. Therefore, the lands 124 and 134 contact the vias 150 and 160 not only at lower surfaces of the lands 124 and 134 but also at side surfaces of the lands 124 and 134. Note that the lands 124 and 134 are configured by a similar material to the land 34 of the first embodiment.

Furthermore, as shown in FIG. 10, the first and third printed wiring bases 110 and 130 respectively include bumps 115 and 135, and solder resists 116 and 136. The bump 115 is provided on a lower surface of the signal-dedicated wiring line 112, and is electrically connected to the mounting board 100. The bump 135 is provided on an upper surface of the signal-dedicated wiring line 132, and is electrically connected to an electrode 91 of the electronic component 90. The solder resist 116 covers the lower surface of the first resin base 111 and the lower surface of the signal-dedicated wiring line 112. The solder resist 136 covers the upper surface of the third resin base 131 and the upper surface of the signal-dedicated wiring line 132.

The above-described multi-layer wiring board 80 according to the second embodiment provides similar effects to those of the first embodiment due to the vias 150 and 160 and the lands 124 and 134 having similar features to those of the first embodiment.

Figure 11A:
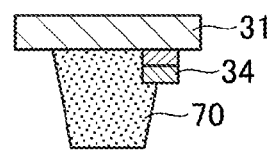
FIG. 11A is a cross-sectional view showing a relationship between a land 34 and a via 70 according to another embodiment of the present invention.
Figure 11B:
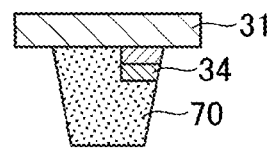
FIG. 11B is a cross-sectional view showing a relationship between a land 34 and a via 70 according to another embodiment of the present invention.
Figure 11C:
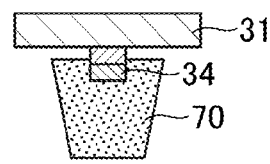
FIG. 11C is a cross-sectional view showing a relationship between a land 34 and a via 70 according to another embodiment of the present invention.

That concludes description of the first and second embodiments of the present invention, but the present invention is not limited to these embodiments, and various changes, additions, and so on, are possible within a scope not departing from the spirit of the invention. For example, as shown in FIGS. 11A to 11C, the via 70 may be contacted only by a portion of the side surface of the land 34. In the example shown in FIG. 11A, only a portion of the side surface and a portion of the lower surface of the land 34 contact the via 70. In the example shown in FIG. 11B, only a portion of the side surface and the entire lower surface of the land 34 contact the via 70. In the example shown in FIG. 11C, only the entire lower surface and a lower portion of the side surface of the land 34 contact the via 70.

Third Embodiment

Figure 12:
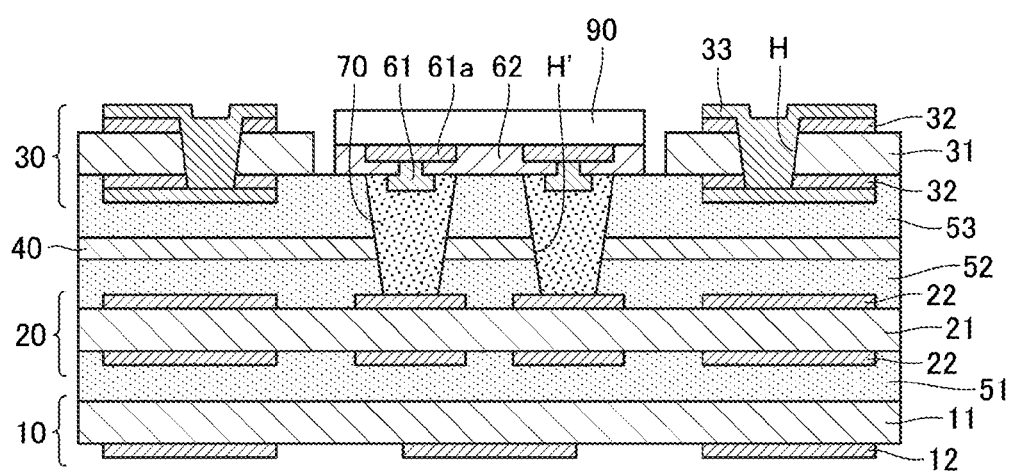
FIG. 12 is a cross-sectional view showing a structure of a multi-layer wiring board according to a third embodiment of the present invention.

FIG. 12 is a cross-sectional view showing a structure of a multi-layer wiring board according to a third embodiment of the present invention. As shown in FIG. 12, the multi-layer wiring board according to the third embodiment comprises a structure in which a first printed wiring base 10, a second printed wiring base 20, a protective layer 40, and a third printed wiring base 30 are stacked by thermal compression bonding (adhesive layers 51 to 53), and an electronic component 90 is mounted thereon.

The adhesive layer 51 adheres between the first printed wiring base 10 and the second printed wiring base 20. The adhesive layer 52 adheres between the second printed wiring base 20 and the protective layer 40. The adhesive layer 53 adheres between the protective layer 40 and the third printed wiring base 30. The protective layer 40 is configured from an insulating film (PET, a polyimide, a liquid crystal polymer (LCP), or the like) in order to prevent a short-circuit between layers during thermal compression bonding. The adhesive layers 51 to 53 are configured from, for example, an epoxy system or acrylic system adhesive, an organic system adhesive, and so on.

Furthermore, as shown in FIG. 12, the multi-layer wiring board includes the electronic component 90 and a via 70. The electronic component 90 is mounted in an opening 39 formed in the third printed wiring base 30, in a state of being directly attached to the adhesive layer 53. The via 70 extends in a stacking direction penetrating the protective layer 40 to be provided between the electronic component 90 and the second printed wiring base 20, that is, in the adhesive layer 53, the protective layer 40, and the adhesive layer 52.

The via 70 is configured by an alloy including a low-melting-point metal filler and a high-melting-point metal filler, and has its surface covered by a thermosetting resin. Now, the metal filler is, for example, nickel, gold, silver, copper, aluminum, iron, tin, bismuth, indium, lead, or the like. The thermosetting resin is a paste whose main component is, for example, an epoxy, an acrylic, a urethane, and so on.

As shown in FIG. 12, the first through third printed wiring bases 10 to 30 respectively include first through third resin bases 11 to 31 and signal-dedicated wiring lines 12 to 32. The signal-dedicated wiring line 12 is formed on a lower surface (one surface) of the first resin base 11. The signal-dedicated wiring line 22 is formed on a lower surface and an upper surface (both surfaces) of the second resin base 21. The signal-dedicated wiring line 32 is formed on a lower surface and an upper surface (both surfaces) of the third resin base 31.

The first through third resin bases 11 to 31 are configured by a resin film. Now, the resin film is, for example, a polyimide, a polyolefin, a liquid crystal polymer (LCP), a thermosetting epoxy resin, or the like. The signal-dedicated wiring lines 12 to 32 are configured by a conductive material such as copper foil formed in a pattern.

In addition, the third printed wiring base 30 includes a signal-dedicated via 33 that fills a via hole H that penetrates the third resin base 31. The signal-dedicated via 33 is connected to each of the signal-dedicated wiring lines 32 formed on both surfaces of the third resin base 31. The signal-dedicated via 33 is formed by, for example, a plating.

The electronic component 90 is configured by a WLP (Wafer Level Package). As shown in FIG. 12, a lower surface of the electronic component 90 is provided with: an electrode 61 of a re-wiring electrode, or the like, connected to a pad 61a; and a resin 62. The electrode 61 is electrically connected to an upper end of the via 70. The resin 62 covers the lower surface of the electronic component 90 so as to expose the electrode 61.

Figure 13:
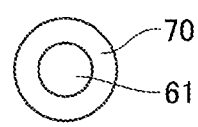
FIG. 13 is a top view showing a relationship between an electrode and a via according to the third embodiment.

Now, FIG. 13 is a top view showing a relationship between the electrode 61 and the via 70 according to the third embodiment. As shown in FIG. 13, a diameter of the electrode 61 is smaller than a diameter of the via 70, and the electrode 61 is embedded in the via 70. Therefore, the electrode 61 contacts the via 70 not only at a lower surface of the electrode 61 but also at a side surface of the electrode 61. The electrode 61 is configured by a conductive material such as Cu, Ni, Au, Al, or the like, and forms an alloy with the via 70.

Assuming the case where the via 70 contacts the lower surface of the electrode 61 and the diameter of the electrode 61 is larger than the diameter of the via 70, a spacing between the electrodes 61 becomes narrow, and the number of electrodes 61 in the electronic component 90 gets reduced. In contrast, in the multi-layer wiring board according to the third embodiment, a high-density layout of the electrodes 61 of the electronic component 90 can be achieved.

Note that in the case where, due to the diameter of the electrode 61 being smaller than the diameter of the via 70 as described above, a contact area of the via 70 and the electrode 61 becomes small and a positional misalignment between the via 70 and the electrode 61 occurs, there is an increased likelihood that a connection defect is caused. In this regard, in the multi-layer wiring board according to the third embodiment, the electrode 61 is embedded in an upper end of the via 70, and not only the lower surface of the electrode 61 contacts the via 70, but also the side surface of the electrode 61 contacts the via 70. Therefore, the contact area can be sufficiently increased and, even if positional misalignment between the via 70 and the electrode 61 occurs, a lowering of contact area between the via 70 and the electrode 61 and a connection defect can be suppressed.

Figure 14:
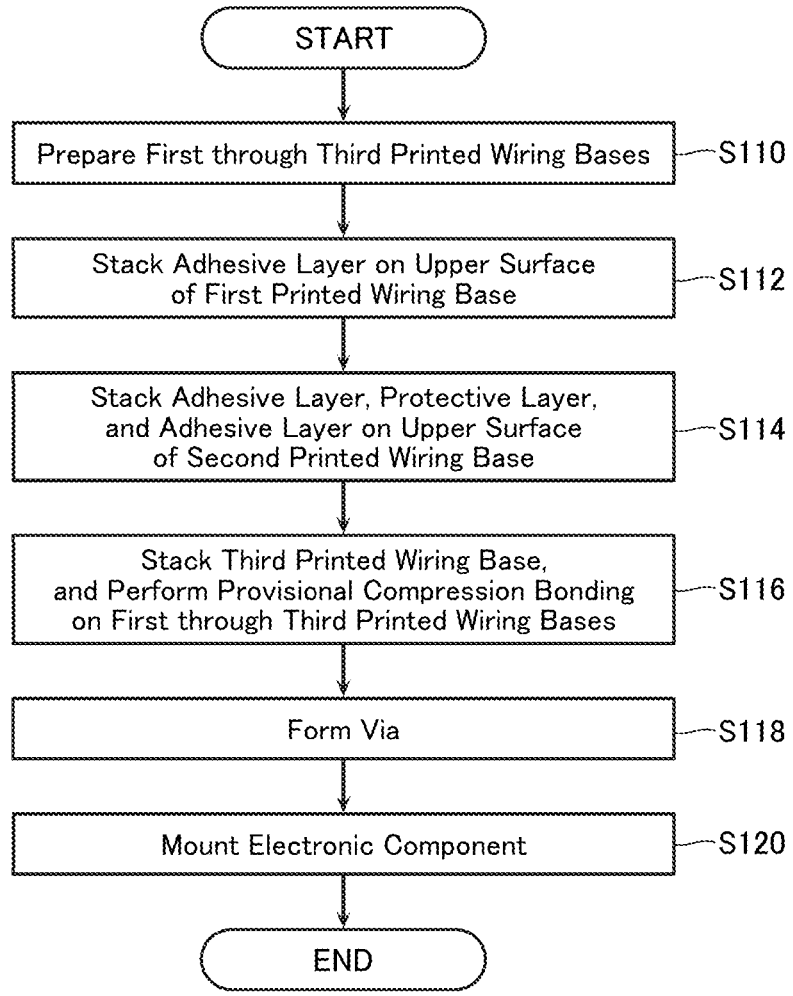
FIG. 14 is a flowchart showing manufacturing processes of the multi-layer wiring board according to the third embodiment of the present invention.

Next, a manufacturing method of the multi-layer wiring board according to the third embodiment will be described in line with FIG. 14, with reference to FIGS. 15 to 19. FIG. 14 is a flowchart showing manufacturing processes of the multi-layer wiring board according to the third embodiment. FIGS. 15 to 19 are cross-sectional views showing schematically the manufacturing processes of the multi-layer wiring board.

Figure 15:
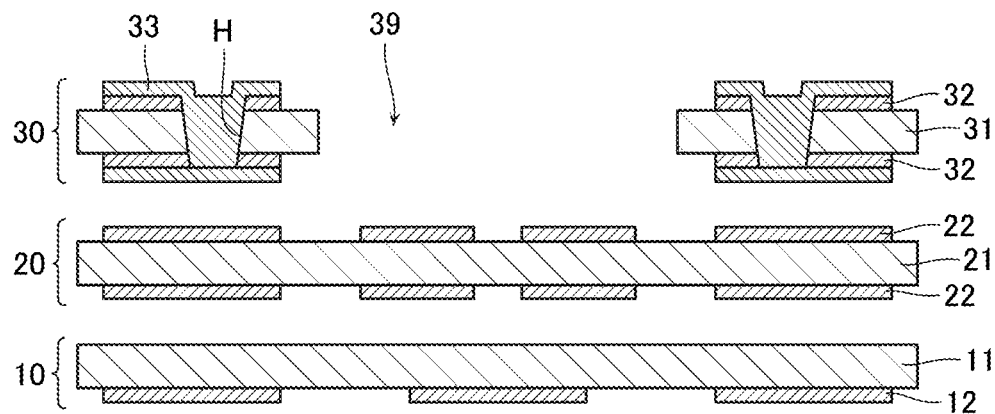
FIG. 15 is a cross-sectional view showing schematically a manufacturing process of same multi-layer wiring board.

First, as shown in FIG. 15, the first through third printed wiring bases 10 to 30 are prepared (step S110 of FIG. 14). Now, the signal-dedicated wiring lines 12 to 32 of the first through third printed wiring bases 10 to 30 are formed by a subtractive method or a semi-additive method. In addition, the opening 39 of the third printed wiring base 30 is formed by laser processing, drill processing, or die processing.

Figure 16:
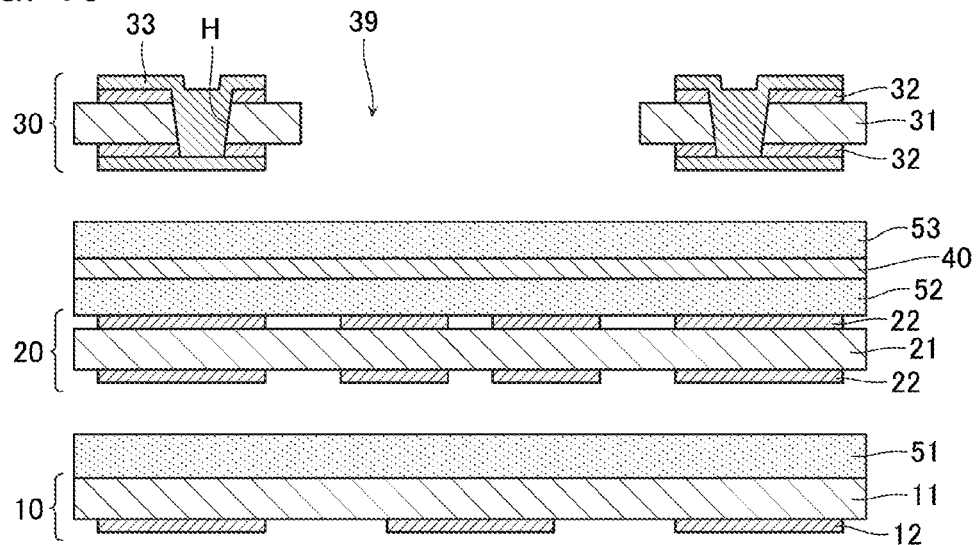
FIG. 16 is a cross-sectional view showing schematically a manufacturing process of same multi-layer wiring board.

Next, as shown in FIG. 16, the adhesive layer 51 is stacked on the upper surface of the first printed wiring base 10 (step S112 of FIG. 14), and furthermore, the adhesive layer 52, the protective layer 40, and the adhesive layer 53 are stacked on the upper surface of the second printed wiring base 20 (step S114 of FIG. 14).

Figure 17:
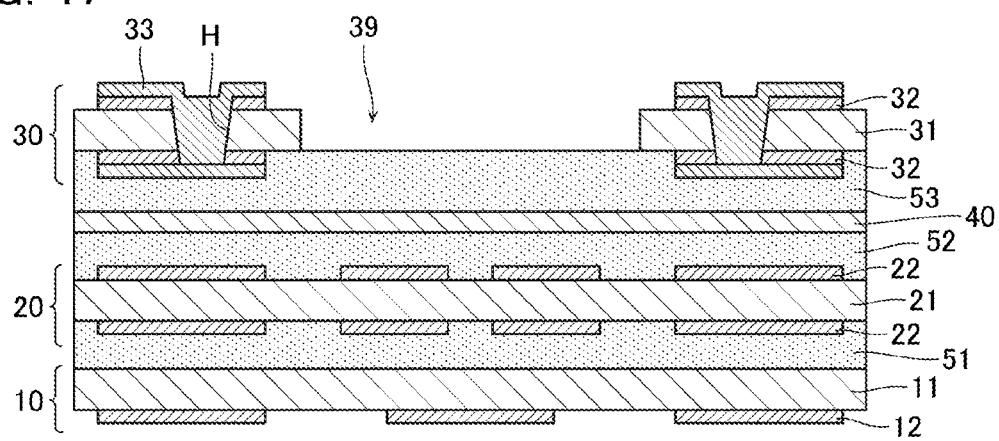
FIG. 17 is a cross-sectional view showing schematically a manufacturing process of same multi-layer wiring board.
Figure 18:
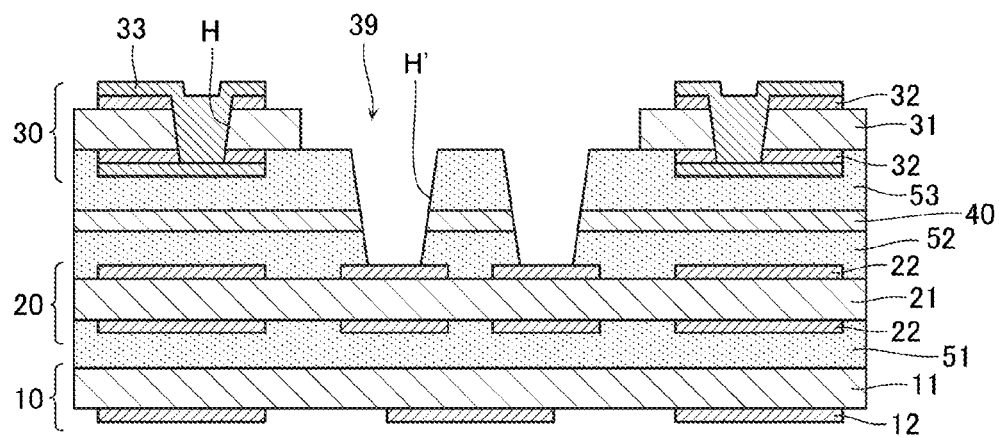
FIG. 18 is a cross-sectional view showing schematically a manufacturing process of same multi-layer wiring board.
Figure 19:
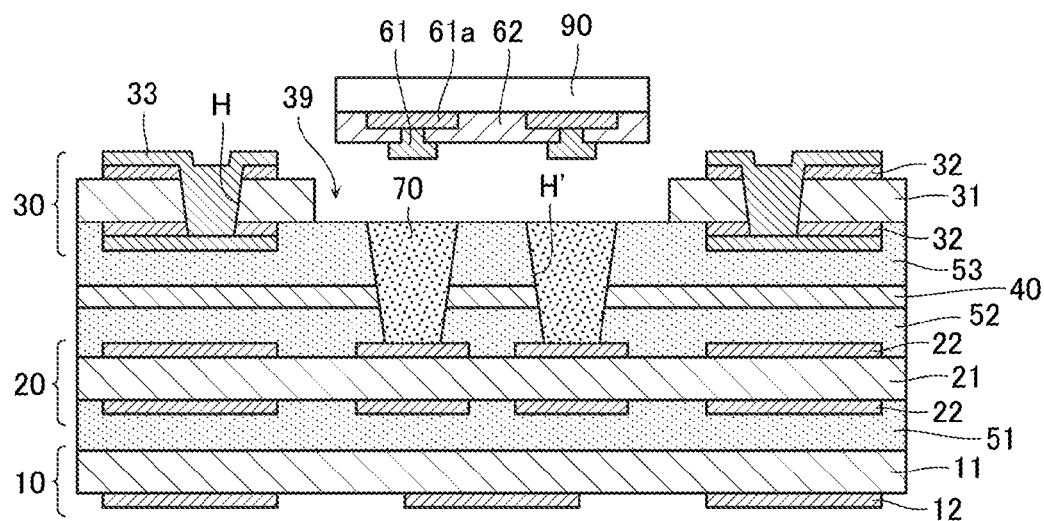
FIG. 19 is a cross-sectional view showing schematically a manufacturing process of same multi-layer wiring board.

Following this, as shown in FIG. 17, the third printed wiring base 30 is stacked on the upper surface of the adhesive layer 53, and the first through third printed wiring bases 10 to 30 undergo provisional compression bonding (step S116 of FIG. 14). Then, as shown in FIG. 18, a hole H' penetrating the adhesive layer 53, the protective layer 40, and the adhesive layer 52 is formed by, for example, laser processing, and, as shown in FIG. 19, the via 70 is formed by filling the hole H' with a conductive paste (step S118 of FIG. 14).

Finally, the electronic component 90 is mounted on the upper surface of the adhesive layer 53, aligned such that the electronic component 90 is housed in the opening 39 of the third printed wiring base 30 (step S120 of FIG. 14), and the first through third printed wiring bases 10 to 30 undergo thermal compression bonding. As a result, the electronic component 90 is mounted in the opening 39 and the first through third printed wiring bases 10 to 30 are compression bonded such that the electrode 61 is embedded in the upper end of the via 70, whereby the multi-layer wiring board shown in FIG. 12 is manufactured.

Note that a lower end of the via 70 not connected to the electrode 61 is connected to a land of the signal-dedicated wiring line 22 formed on the upper surface of the second resin base 21 of the second printed wiring base 20. During this compression bonding of the electrode 61 and the via 70, the low-melting-point metal filler and the thermosetting resin in the via 70 melt. The melted low-melting-point metal filler forms an alloy with copper, and so on, of the electrode 61.

Fourth Embodiment

Next, a multi-layer wiring board according to a fourth embodiment of the present invention will be described with reference to FIG. 20. The multi-layer wiring board according to the third embodiment was a multi-layer wiring board having an electronic component 90 mounted thereon. However, the multi-layer wiring board according to the fourth embodiment functions as a component-built-in board having a built-in component 60 built therein.

Figure 20:
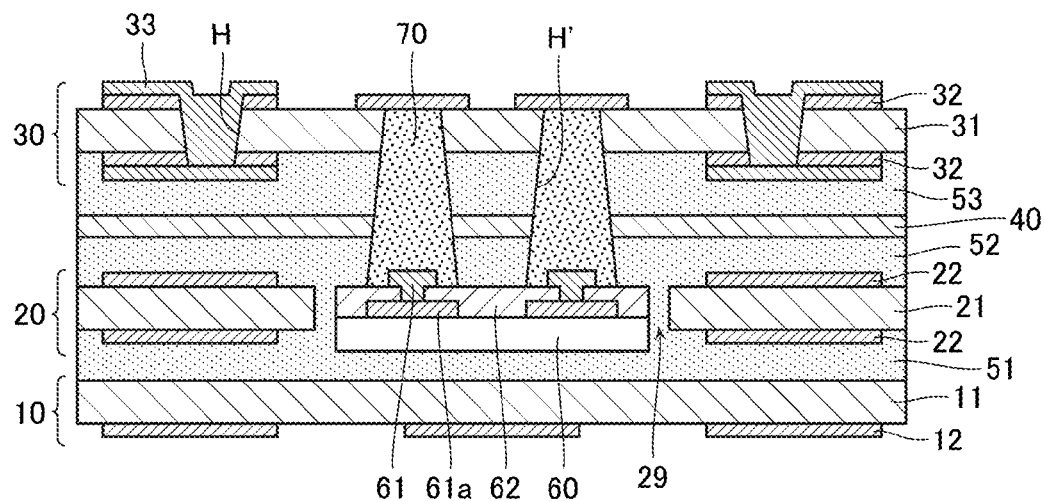
FIG. 20 is a cross-sectional view showing a structure of a multi-layer wiring board according to a fourth embodiment of the present invention.

FIG. 20 is a cross-sectional view showing a structure of the multi-layer wiring board according to the fourth embodiment of the present invention. As shown in FIG. 20, the multi-layer wiring board according to the fourth embodiment comprises a structure in which a first printed wiring base 10, a second printed wiring base 20, a protective layer 40, and a third printed wiring base 30 are stacked by thermal compression bonding (adhesive layers 51 to 53), and the built-in component 60 is built therein.

Basic configurations of the adhesive layers 51 to 53, the protective layer 40, the first through third printed wiring bases 10 to 30, and the built-in component 60 are similar to those of the adhesive layers 51 to 53, the protective layer 40, the first through third printed wiring bases 10 to 30, and the electronic component 90 described in the third embodiment. Therefore, basically, differences from the third embodiment will be described below.

As shown in FIG. 20, the multi-layer wiring board according to the fourth embodiment includes the built-in component 60 and a via 70. The built-in component 60 is built in to an opening 29 formed in the second printed wiring base 20, in a state of being sandwiched by the first and third printed wiring bases 10 and 30. The via 70 extends in a stacking direction penetrating the protective layer 40 to be provided between the built-in component 60 and a signal-dedicated wiring line 32 on the upper surface of the third printed wiring base 30, that is, in the adhesive layer 52, the protective layer 40, the adhesive layer 53, and a third resin base 31.

The built-in component 60 is configured by a WLP, similarly to the electronic component 90, and, as shown in FIG. 20, an upper surface of the built-in component 60 is provided with: an electrode 61 of a re-wiring electrode, or the like, connected to a pad 61a; and a resin 62, the electrode 61 being electrically connected to a lower end of the via 70. The resin 62 covers the upper surface of the built-in component 60 so as to expose the electrode 61.

A diameter of the electrode 61 of the built-in component 60 is configured to be smaller than a diameter of the via 70. An upper end of the via 70 is connected to a land of the signal-dedicated wiring line 32 formed on an upper surface of the third resin base 31 of the third printed wiring base 30, in a state of penetrating the third resin base 31. The multi-layer wiring board according to the fourth embodiment configured as above is also able to provide similar working effects to those of the above-described multi-layer wiring board according to the third embodiment.

Figure 21:
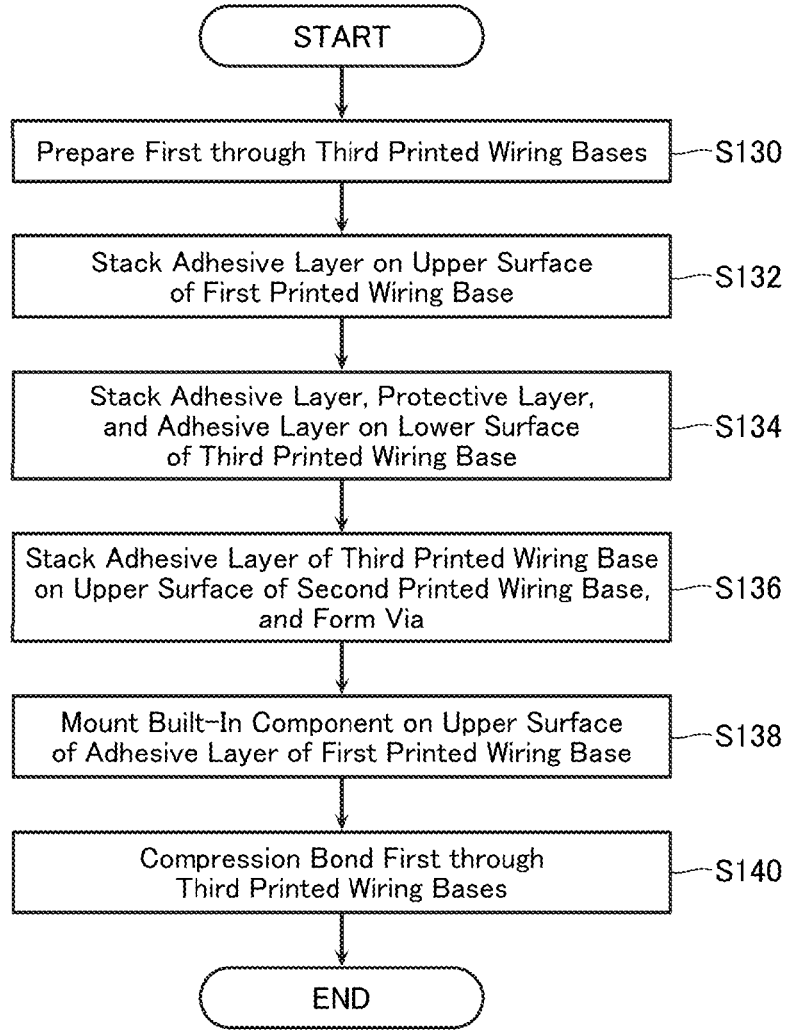
FIG. 21 is a flowchart showing manufacturing processes of the multi-layer wiring board according to the fourth embodiment of the present invention.

Next, a manufacturing method of the multi-layer wiring board according to the fourth embodiment will be described in line with FIG. 21, with reference to FIGS. 22 to 25. FIG. 21 is a flowchart showing manufacturing processes of the multi-layer wiring board according to the fourth embodiment. FIGS. 22 to 25 are cross-sectional views showing schematically the manufacturing processes of the multi-layer wiring board.

Figure 22:
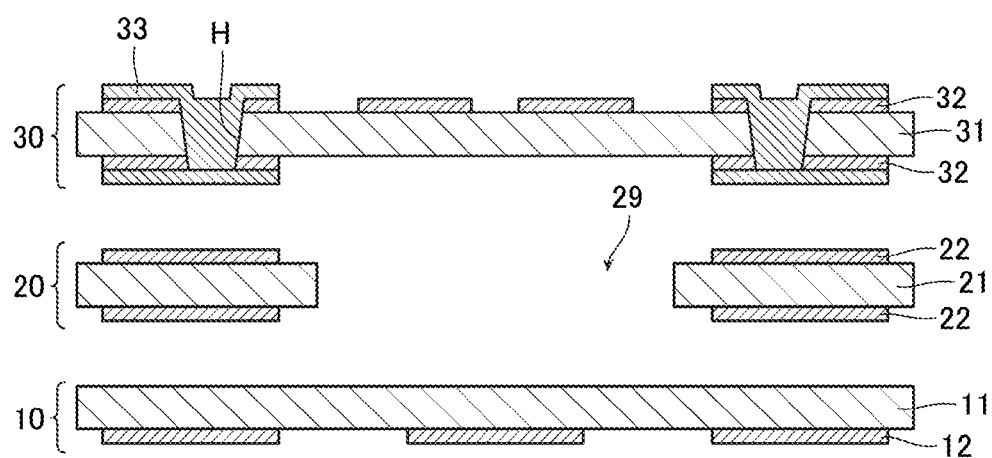
FIG. 22 is a cross-sectional view showing schematically a manufacturing process of same multi-layer wiring board.
Figure 23:
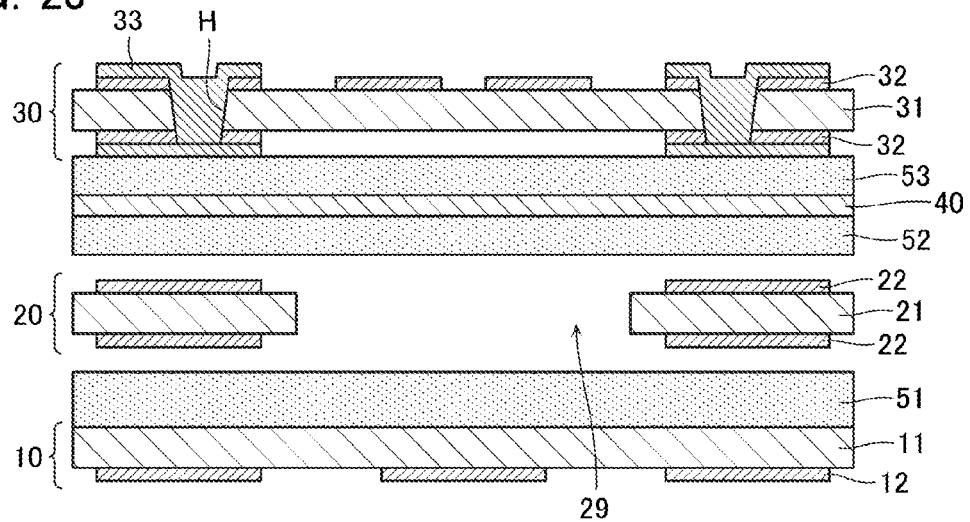
FIG. 23 is a cross-sectional view showing schematically a manufacturing process of same multi-layer wiring board.

First, as shown in FIG. 22, the second printed wiring base 20 in which the opening 29 is formed and the first and third printed wiring bases 10 and 30 are prepared (step S130 of FIG. 21). Next, as shown in FIG. 23, the adhesive layer 51 is stacked on an upper surface of the first printed wiring base 10 (step S132 of FIG. 21), and the adhesive layer 53, the protective layer 40, and the adhesive layer 52 are stacked on a lower surface of the third printed wiring base 30 (step S134 of FIG. 21).

Figure 24:
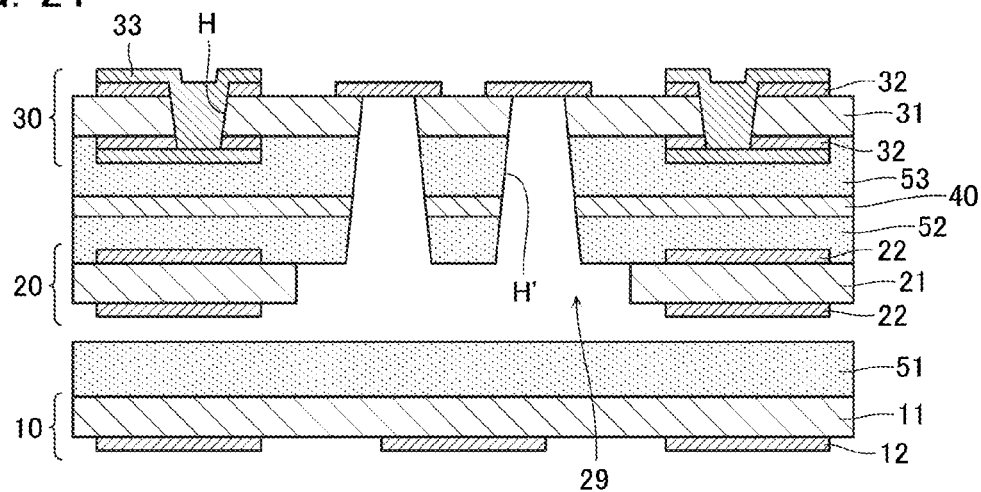
FIG. 24 is a cross-sectional view showing schematically a manufacturing process of same multi-layer wiring board.
Figure 25:
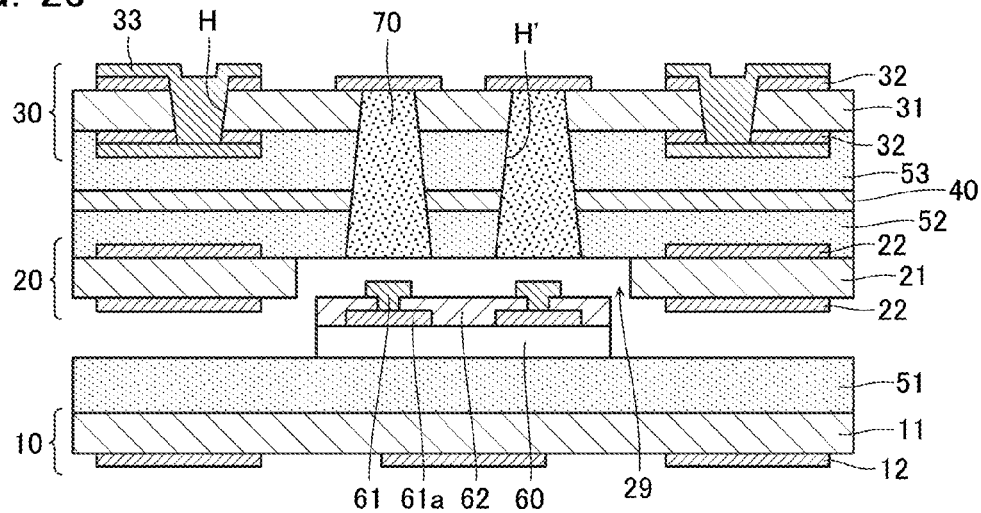
FIG. 25 is a cross-sectional view showing schematically a manufacturing process of same multi-layer wiring board.

Following this, as shown in FIG. 24, the adhesive layer 52 stacked on the third printed wiring base 30 is stacked on an upper surface of the second printed wiring base 20, a hole H' penetrating the adhesive layer 52, the protective layer 40, the adhesive layer 53, and the third resin base 31 is formed by laser processing, and, as shown in FIG. 25, the via 70 is formed by filling the hole H' with a conductive paste (step S136 of FIG. 21).

Then, the built-in component 60 is mounted on an upper surface of the adhesive layer 51 stacked on the first printed wiring base 10 (step S138 of FIG. 21), and, after the second printed wiring base 20 is stacked on the upper surface of the adhesive layer 51 so as to house the built-in component 60 in the opening 29, the first through third printed wiring bases 10 to 30 undergo thermal compression bonding (step S140 of FIG. 21).

That concludes description of the third and fourth embodiments of the present invention, but the present invention is not limited to these embodiments, and various changes, additions, and so on, are possible within a scope not departing from the spirit of the invention. For example, as shown in FIGS. 26A to 26C, the via 70 may be contacted only by a portion of a side surface of the electrode 61.

Figure 26A:
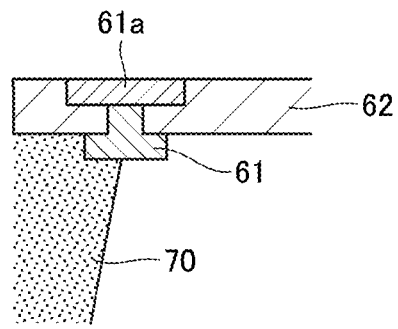
FIG. 26A is a cross-sectional view showing a relationship between an electrode and a via according to another embodiment of the present invention.
Figure 26B:
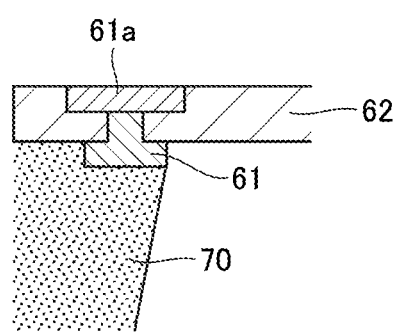
FIG. 26B is a cross-sectional view showing a relationship between an electrode and a via according to another embodiment of the present invention.
Figure 26C:
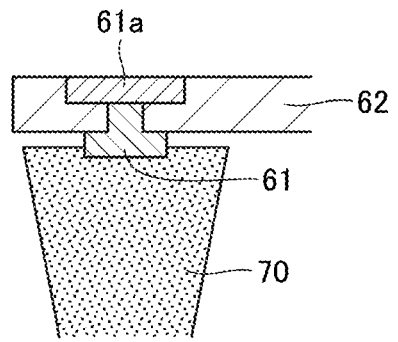
FIG. 26C is a cross-sectional view showing a relationship between an electrode and a via according to another embodiment of the present invention.

In the example shown in FIG. 26A, only a portion of the side surface and a portion of the lower surface of the electrode 61 contact the via 70. In the example shown in FIG. 26B, only a portion of the side surface and the entire lower surface of the electrode 61 contact the via 70. In the example shown in FIG. 26C, only the entire lower surface and a lower portion of the side surface of the electrode 61 contact the via 70.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi-layer wiring board, comprising: a first resin base; a wiring pattern provided on the first resin base and including a land; an adhesive layer on which the first resin base is stacked; a second resin base disposed on the adhesive layer opposite to the first resin base; and a via formed in the adhesive layer and having an end connected to the land, at least a portion of a side surface of the land contacting the via, wherein only a part of the side surface of the land contacts the via and only a part of a bottom surface of the land contacts the via, and wherein the land is embedded in the via and a diameter of the land is smaller than a diameter of the via.

2. The multi-layer wiring board according to claim 1, wherein
   an electronic component is built in the multi-layer wiring board, the electronic component including a plurality of electrode pads arranged with a certain pitch in the electronic component, and
   an end of the via to which the land is not connected is connected to the electrode pad.

3. The multi-layer wiring board according to claim 1, wherein the end of the via contacts the first resin base where the land is formed.

4. A multi-layer wiring board, comprising: an electronic component; an electrode provided to the electronic component; an adhesive layer on which the electronic component is stacked; and a via formed in the adhesive layer and having an end connected to the electrode, wherein a largest diameter of the electrode is smaller than a diameter of the via and the electrode is embedded in the via such that at least a portion of a side surface of the electrode contacts the via, and wherein only a part of the side surface of the electrode contacts the via and only a part of a bottom surface of the electrode contacts the via, and wherein the electrode is embedded in the via and a diameter of the electrode is smaller than a diameter of the via.

5. The multi-layer wiring board according to claim 4, further comprising:
   a wiring pattern provided on a resin base and including a land,
   wherein an end of the via which is not connected to the electrode is connected to the land.

6. The multi-layer wiring board according to claim 4, wherein the largest diameter of the electrode is smaller than the diameter of the via at the connection between the via and the electrode.

7. A multi-layer wiring board, comprising: a built-in component; an electrode provided to the built-in component; an adhesive layer on which the built-in component is stacked; and a via formed in the adhesive layer and having an end connected to the electrode, wherein a largest diameter of the electrode is smaller than a diameter of the via and the electrode is embedded in the via such that at least a portion of a side surface of the electrode contacts the via, and wherein only a part of the side surface of the electrode contacts the via and only a part of a bottom surface of the electrode contacts the via, and wherein the electrode is embedded in the via and a diameter of the electrode is smaller than a diameter of the via.

8. The multi-layer wiring board according to claim 7, further comprising:
- a wiring pattern provided on a resin base and including a land,
- wherein an end of the via not connected to the electrode is connected to the land.

9. The multi-layer wiring board according to claim 7, wherein the largest diameter of the electrode is smaller than the diameter of the via at the connection between the via and the electrode.

* * * * *